(12) United States Patent
Lamprecht et al.

(10) Patent No.: US 12,308,267 B2
(45) Date of Patent: May 20, 2025

(54) APPARATUS FOR TRANSPORTING SEMICONDUCTOR WAFERS

(71) Applicant: SILTRONIC AG, Munich (DE)

(72) Inventors: Ludwig Lamprecht, Truchtlaching (DE); Thoralf Vogel, Lengefeld (DE)

(73) Assignee: SILTRONIC AG, Munich (DE)

( * ) Notice: Subject to any disclaimer, the term of this patent is extended or adjusted under 35 U.S.C. 154(b) by 21 days.

(21) Appl. No.: 18/552,445

(22) PCT Filed: Mar. 23, 2022

(86) PCT No.: PCT/EP2022/057571
§ 371 (c)(1),
(2) Date: Sep. 26, 2023

(87) PCT Pub. No.: WO2022/207419
PCT Pub. Date: Oct. 6, 2022

(65) Prior Publication Data
US 2024/0178026 A1    May 30, 2024

(30) Foreign Application Priority Data

Apr. 1, 2021  (EP) .................................. 21166539

(51) Int. Cl.
*H01L 21/673* (2006.01)
(52) U.S. Cl.
CPC .... *H01L 21/6733* (2013.01); *H01L 21/67366* (2013.01); *H01L 21/67383* (2013.01)

(58) Field of Classification Search
USPC .................................................. 206/710, 711
See application file for complete search history.

(56) References Cited

U.S. PATENT DOCUMENTS 11,581,209 B2 *   2/2023  Steffens ............ H01L 21/67383
2001/0042439 A1  11/2001  Roberson et al.
(Continued)

FOREIGN PATENT DOCUMENTS

DE          4223326 A1      1/1993
EP          3929969 A1 *  12/2021   ....... H01L 21/67366
(Continued)

*Primary Examiner* — Bryon P Gehman
(74) *Attorney, Agent, or Firm* — LEYDIG, VOIT & MAYER, LTD.

(57) ABSTRACT

A transport container transports semiconductor wafers. The transport container includes: a mandated 3D printed shape, including a device in a base that is suitable for removing liquid media; and at a surface of the transport container, a coating material configured for protection from chemicals capable of etching the wafers. The coating material is applied by of a low-temperature coating process. The coating material consists of polytetrafluoroethylene, perfluoroalkoxy polymer, or polyvinylidene fluoride. The mandated form of the transport container also includes an integrated workpiece holder for the wafers or carriers for the wafers, configured such that that the wafers to be transported are loadable in standing form. The transport container is configured for a designated transport direction of the transport container in an automatic transport system that runs parallel to a front or rear side of the semiconductor wafers.

10 Claims, 3 Drawing Sheets

(56) References Cited

U.S. PATENT DOCUMENTS

| | | |
|---|---|---|
| 2004/0206663 A1 | 10/2004 | Extrand |
| 2005/0236110 A1 | 10/2005 | Bhatt et al. |
| 2015/0104276 A1 | 4/2015 | Lee et al. |
| 2016/0370797 A1 | 12/2016 | Azarya et al. |
| 2018/0056291 A1 | 3/2018 | Bores |
| 2020/0157265 A1 | 5/2020 | Ganapathiappan et al. |
| 2021/0143040 A1 | 5/2021 | Steffens et al. |

FOREIGN PATENT DOCUMENTS

| | | |
|---|---|---|
| JP | H04269751 A | 9/1992 |
| JP | H10284586 A | 10/1998 |
| JP | 2001343621 A | 12/2001 |
| JP | 2018526814 A | 9/2018 |
| TW | M577796 U | 5/2019 |
| TW | 202028369 A | 8/2020 |
| WO | WO 2004050218 A1 | 6/2004 |

\* cited by examiner (a)

(b)

(c)

(d)

(e)

APPARATUS FOR TRANSPORTING SEMICONDUCTOR WAFERS

CROSS REFERENCE TO RELATED APPLICATIONS

This application is a U.S. National Phase application under 35 U.S.C. § 371 of International Application No. PCT/EP2022/057571, filed on Mar. 23, 2022, and claims benefit to European Patent Application No. EP 21166539.3, filed on Apr. 1, 2021. The International Application was published in German on Oct. 6, 2022 as WO 2022/207419 A1 under PCT Article 21(2).

FIELD

The present disclosure relates to an apparatus in the form of a transport container for semiconductor wafers, which is suitable for use in an overhead hoist transport system.

BACKGROUND

In the production and processing of semiconductor wafers made from silicon or other semiconductor materials, transport containers are used between the individual operating steps in order to be able to transport the semiconductor wafers and/or maintain them in a defined orientation.

The transport containers here are generally configured such that wafer cassettes can be placed together with the wafers into the containers and transported manually or with an automated guided vehicle (AGV).

The loading and unloading of the wafer cassettes from the transport containers takes up a lot of time, depending on the level of automation.

As a result of the numerous movements during transport, moreover, there is an increased risk of damage to the wafers transported.

Firstly, there are floor-based transport systems, which are operated, for example, with automated guided vehicles (AGVs) or with carts that are pushed by hand on the floor of the cleanroom.

Secondly there are ceiling-based transport systems which are operated on a rail system secured on the ceiling of the cleanroom. Particularly advantageous in this case is the use of an overhead hoist transport system.

Floor-based transport systems with AGVs or carts pushed by hand require dedicated transport pathways between the operating units. Within cleanrooms, this leads to costly additional cleanroom areas and in some cases long transport paths, since the direct routes are occupied by the operating equipment.

The use of an overhead hoist transport system (OHT) overcomes the stated disadvantages, as the wafers, for example, can be transported under the ceiling and so do not take up additional cleanroom area. One example of this is indicated in patent application US 2015 104 276 AA.

Transport containers for semiconductor wafers may be manufactured as thermoformed, injection-molded, cast or welded containers. As has been found, however, there are limits to possible shaping and functional features of the containers as a result of these manufacturing processes.

The specification US 2004/206663 A1 describes a container with ultraphobic surfaces for promoting more effective cleaning and drying of the container.

The specification WO 2004/005163 A1 relates to a transport container for wafers, with parts of said container having been produced from fire-retardant materials.

The specification US 2005/236110 A1 relates generally to a system and a method for introducing a thin protective thermopolymer film, such as PEEK, for example, into the shaping operation for handheld appliances, transporters, carriers, trays and similar devices which can be used in the semiconductor processing industry.

The specification DE 42 23 326 A1 relates to a carrier for semiconductor wafers that comprises a carrier substructure, with a diamond coating provided at least on a portion of the substructure.

A carrier system, in semiconductor fabrication also called a "loadport", is constituted both by the mechanical and by the electrical interface between a transport container and an operating unit. The transport containers are placed onto this system by the transport system in order to load and unload the process unit. In widespread use here are loadports which meet the SEMI standard and which allow the fitting of common semiconductor transport boxes such as FOUP (Front Opening Unified Pods), FOSB (Front Opening Shipping Boxes), OC (Open Cassettes), and SMIF pods (Standard Mechanical Interface).

There is therefore, as recognized by the present inventors, a demand for improved semiconductor wafer transport containers that enable use in conjunction with overhead hoist transport (OHT) systems, including specifically for the wet transport of semiconductor wafers and their production.

SUMMARY

In an embodiment, the present disclosure provides a transport container that transports semiconductor wafers. The transport container includes: a mandated shape generated from a base material by 3D printing; and in at least a region of a surface of the transport container, a coating material configured for protection from chemicals capable of etching the semiconductor wafers. The coating material is applied by of a low-temperature coating process. The coating material consists of polytetrafluoroethylene, perfluoroalkoxy polymer, or polyvinylidene fluoride. The mandated form of the transport container includes a device in the base that is suitable for removing liquid media. The mandated form of the transport container comprises one or more integrated workpiece holders for the semiconductor wafers or carriers for the semiconductor wafers, configured such that that the semiconductor wafers to be transported are loadable in standing form. The transport container is configured for a designated transport direction of the transport container in an automatic transport system that runs parallel to a front or rear side of the semiconductor wafers.

BRIEF DESCRIPTION OF THE DRAWINGS

Subject matter of the present disclosure will be described in even greater detail below based on the exemplary figures. All features described and/or illustrated herein can be used alone or combined in different combinations. The features and advantages of various embodiments will become apparent by reading the following detailed description with reference to the attached drawings, which illustrate the following.

DETAILED DESCRIPTION

Figure 1:
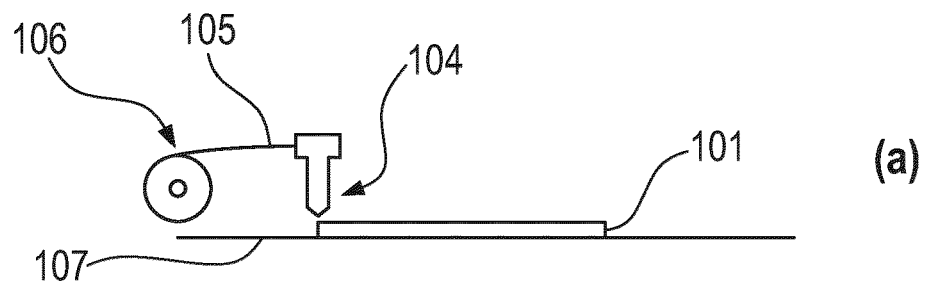
FIGS. 1a-e show schematically a sequence of a process in a preferred embodiment.
Figure 1:
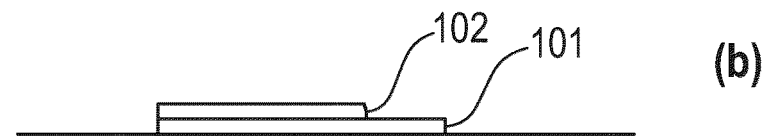
Figure 1:
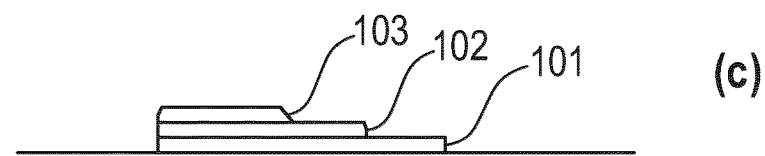
Figure 1:
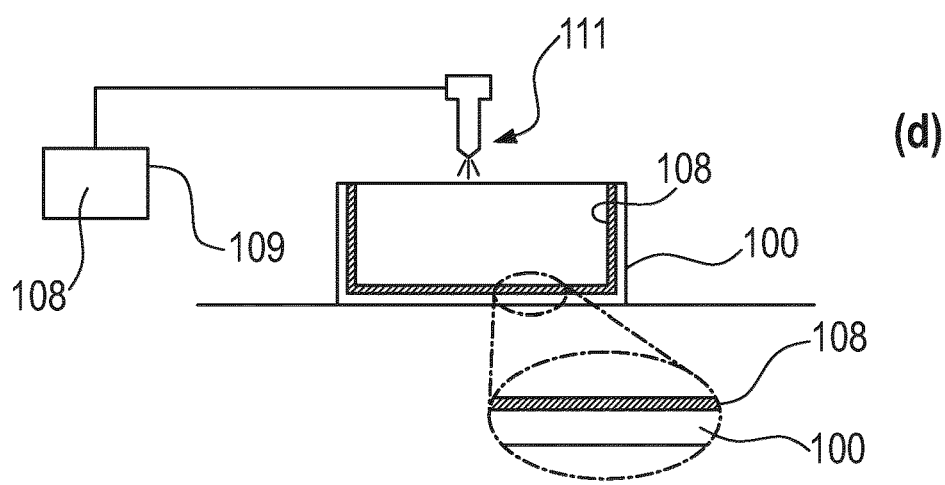
Figure 1:
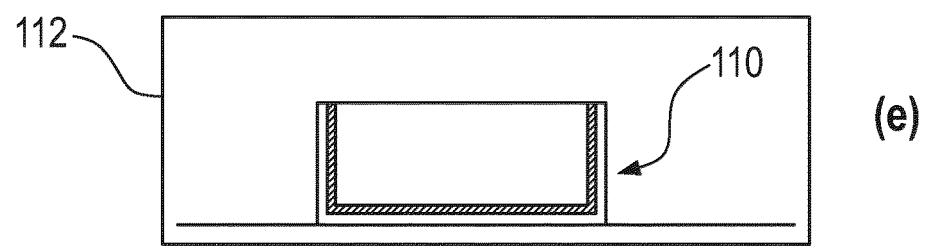

The disclosure provides a transport container for semiconductor wafers.

The disclosure is concerned with a transport container for semiconductor wafers, such as silicon wafers for example. It involves the generation of a container having a mandated shape from a base material by means of an additive construction or manufacturing process—this may more particularly entail 3D printing. Accordingly, for example, the base material is added layer by layer until eventually the desired mandated shape has been produced. Subsequently, at least in predetermined regions of a surface of the container (constructed in this way), a coating material for protection from chemicals is applied—that is, the container is rendered chemicals-resistant by means of a coating (which serves as a protective coat).

The coated container may then be referred to as the transport container. The relevant regions of the surface to which the coating material is applied are more particularly those regions which are intended for subsequent contact with corresponding media or chemicals in the course of use, and should therefore be protected. This concerns in particular the inside of the container, which is typically open at the top. In a particularly advantageous embodiment, a transport container has a lid, which more particularly may be impervious to liquids, which wet the inner surface of the lid.

By means of an additive construction process or by means of 3D printing it is possible to manufacture transport containers that are in multiple respects optimized relative to conventional production processes, being optimized, for example, for dry or wet transports with AGV and overhead hoist transport systems. This is possible particularly by virtue of free-design shaping, including integrated mechanical structural elements as part of the container produced in this way, and without additional components, which have to be connected retrospectively to the conventionally produced containers. In addition, chemical resistance, surface nature, integrated and chargeable power supplies, mechanical coupling elements, sensors, couplings for external energy and media supplies, integrated holders for semiconductor wafers, and fluidic functional features for the respective applications can be chosen more variably and with more adaptation relative to the conventional production processes, as will be elucidated in more detail hereinafter.

An improved or, indeed, optimized chemical resistance is achieved through the application of the coating material, which serves as or produces a surface sealing. Preferred coating materials in this context are polytetrafluoroethylene, PTFE, perfluoroalkoxy polymer, PFA, and polyvinylidene fluoride, PVDF.

The inventors have recognized that containers produced exclusively from a base material by means of an additive construction process such as 3D printing cannot be used as transport containers for semiconductor wafers because the roughness of the surfaces is too pronounced. The surfaces have a severe roughness for the desired use, resulting in organic and inorganic contaminants depositing on and in the surfaces, so negatively impacting the quality of the semiconductor wafers being transported.

Because of the coating with, for example, PTFE on the relevant surfaces of a container produced by means of an additive construction process (3D printing), however, it is now possible to combine the positive properties of a conventionally produced transport container (that is, in particular, the chemicals resistance) with the positive properties of a container for semiconductor wafers, typically silicon wafers, produced by means of an additive construction process (that is, in particular, the free shaping).

Given that a container produced by means of an additive construction process undergoes severe thermal loading in conventional coating processes and would therefore deform, a low-temperature coating process has been developed in combination with the additive construction process.

The high-purity coatings required for operations in the case of semiconductor wafers are conventionally applied at high temperatures to surfaces.

As a result of the controlled use of a low-temperature coating process, preferably with a temperature below 150° C., coatings of high purity can also be applied to the less temperature-stable surfaces of, for example, 3D-printed containers and it is possible consequently to bring together the advantages such as free shaping, controlled feeding and removal of the chemicals into and from the transport container, and the chemical and physical properties.

For example, the material PA 3200GF has a dimensional integrity temperature (at a pressure of 0.45 MPa and in X-direction) of max. 157° C. according to ISO 75-1/-2. Comparable figures apply to the preferred base materials comprising a polyamide, particularly with fillers. If this temperature is exceeded, the plastic contour typically collapses in on itself. PTFE coatings, for example, are applied generally by spraying and are sintered in an oven at a temperature of about 220° C. to 420° C. As a result of a low-temperature sintering process, which typically extends over a prolonged period of time at 100° C., for example, it has been possible to make a 3D-printed silicon wafer container resistant to chemicals and to soiling.

The surface roughness of the containers produced by means of an additive construction process (3D printing) can be reduced by means of low-temperature coatings—typically the Rz and Ra values (which specify the roughness) can be reduced by around 70% relative to the corresponding values of the container without the low-temperature coating. Hence this also contributes to significantly reduced adhesion of particles or other organic or inorganic constituents of the liquids to the (container) surfaces in the transport container, which also allows these to be removed much more easily and in a controlled way when the liquid is to be changed.

The proposed additive construction process (3D printing) permits optimized container designs, in other words transport containers optimized in terms of shape and adaptability for use in combination with overhead hoist transport systems. For example, a weight-optimized liquid volume of the transport container is possible through the easy manufacturing possibility of adapting the shape of the container to the semiconductor wafers transported therein, so that the quantities of medium or chemicals needed on use of the transport container are not unnecessarily high (meaning that the volume in which liquid is accommodated is kept as low as possible, for example).

In a preferred embodiment, the mandated shape of the container comprises a means of removing media or chemicals, and with particular preference, there are also a plurality of feeds and/or removal means.

In a preferred embodiment, there are also one or more integrated workpiece holders for one or more semiconductor wafers or their carriers. The design of a workpiece holder may be such, for example, that one or more semiconductor wafers can be inserted and held therein directly.

In a preferred embodiment, a workpiece holder may also be designed such that a carrier, a cassette or another holder can be introduced into it, in which in turn one or preferably two or more semiconductor wafers may then be introduced and held. A wafer holder (cassette) for five, ten, fifteen or twenty-five silicon wafers is introduced preferably into a workpiece holder, allowing these silicon wafers to be introduced and/or withdrawn together, without having to introduce or withdraw the wafers together with the wafer racks.

In this context the term "batch handling" is commonplace within semiconductor fabrication. This involves the entire amount of wafers, in the 3D-printed transport containers and in the wafer holders located therein, being simultaneously or individually introduced or withdrawn. As a result, the time-consuming operations of loading and unloading with wafer cassettes are dispensed with. By eliminating the cassette loading and the cassette unloading, additionally, there is also a reduction in the risk of damage to the wafers at the interfaces with the cassettes as a result of vibrations.

In a preferred embodiment, moreover, one or more frames and/or one or more securement means are provided for attachment and automatic coupling to various operating units. Stiffening elements integrated into the container shape are preferred in particular.

The automatic coupling of the transport container to operating units is accomplished. in a preferred embodiment, in conjunction with overhead hoist transport systems by the placement of the containers on mechanical, electrical, data-processing and/or fluidic coupling elements integrated for that purpose in operating units.

In this context, three or more mechanical components are preferably employed. In the region of contact with the transport container, they may be configured in the form of pins with a beveled, rounded, conical or frustoconical head-piece or else in roller form. Their arrangement on a carrier system may involve rotational symmetry, axial symmetry or an asymmetric distribution over the area. The carrier system may comprise additional shape elements which allow the transport container for placement to be prepositioned in a horizontal X-Y direction. Furthermore, stabilizing elements may be located on the carrier system that prevent lateral tipping of the transport container.

The weight of the filled transport containers here is, in a preferred embodiment, more than 25 kg and less than 120 kg.

In a preferred embodiment, integrated into the transport containers are requisite counterpieces which, through connections which, with particular preference, are form-fitting, produce the mechanical, electrical and/or fluidic connections between operating units and transport container as a result of the placement of the containers.

In a preferred embodiment, feed means and removal means may be integrated into the shape and in that case can have any desired designs.

In the case of conventionally manufactured transport containers, feed and removal facilities, supply lines and adapters are realized typically by means of additional conduits, electrical lines and mechanical adapters including attachments on the container.

Conversely, the additive construction process or 3D printing enables such elements to be integrated into the container shape, into side walls or the base, for example, and allows the entrance and exit ports to be located in a targeted way at those points which are ideal for rapid and physically close supplying of the media, power and data connections and for the mechanical coupling of the containers to the operating units or transport systems, overhead hoist transport systems for example. With preference, this may in this case also be designed in a targeted way, according to the desired use of the transport container, for different transport systems, such as AGVs or overhead hoist transport systems, for which it is primarily to be used.

Specifically for application as wet transport containers for overhead hoist transport systems, an additive manufacturing process, such as 3D printing, for example, allows the upper container edge to be designed and produced very accurately and simply for the accommodation of the container by the so-called shuttle (the OHT transport vehicle), which is equipped, in a preferred embodiment, with lowerable holding apparatuses for containers. As a result of the accurate production it is ensured that the containers can also be used with customary commercial overhead hoist transport systems.

The inventors have recognized that by means of the additive manufacturing process it is possible to integrate the integrated mechanical coupling elements with great positional accuracy for a multiplicity of identically configured transport containers. The absolute positioning accuracy of the mechanical coupling elements in conjunction with the wafer holders, integrated by means of additive manufacturing processes, are prerequisites for identical loading/unloading operations carried out on different process equipment, without having to equip the loading/unloading devices, such as wafer-loading/unloading robots, separately for each transport container. A high reproducibility of the process sequence can therefore be ensured.

The inventors have further recognized that application, specifically in conjunction with overhead hoist transport systems, is the prerequisite for direct routing between operating units in the case of sequential processing of the wafers.

Feedback times from downstream operating steps for the purpose of controlling the antecedent operating steps often play a substantial part in compliance with specified product requirements.

The inventors have also recognized that, in comparison to conventional wafer cassette transports, having taken place up to now by means of floor-based transport means in the case of wet transports, it is possible when using overhead hoist transports to reduce the feedback times further and so to allow more effective control of the antecedent operations.

A prerequisite for wet transports with overhead hoist transport systems is the use of transport containers of the disclosure that are especially suitable for such systems.

One preferred transport container for transporting semiconductor wafers has been produced from a base material by means of 3D printing with a mandated shape.

At least a region of a surface of the transport container in this case comprises a coating material for protection from chemicals.

The chemicals used in the fabrication of semiconductor wafers are in some cases acidic or alkaline, and chemical residues or chemicals deliberately supplied are also located within the transport containers. A common feature of these chemicals is that they are also capable of contaminating or etching surfaces of transport containers. As a result of the coating described, the surfaces are protected from etching, the adhesion of chemicals and impurities is reduced, and the cleaning of the containers is improved.

The coating in this case has been applied by means of a low-temperature coating process. Particularly preferred in this context is a low-temperature sintering process. The operation is carried out, in a preferred embodiment, at a temperature of below 150° C.

The coating here consists. in a preferred embodiment, of one of the materials polytetrafluoroethylene, perfluoro-alkoxy polymer or polyvinylidene fluoride.

A mandated shape of the transport container, in a preferred embodiment, comprises an apparatus in the base that is suitable for removing liquid media. With particular preference this apparatus is designed as a valve for rapidly emptying the liquid contained in the transport container.

The valve, in this case, is more preferably designed such that it is opened automatically by the deposition of the container. This deposition takes place at a suitable station.

Oftentimes media are fed into and taken off from the transport containers for wet transport of semiconductor wafers in a controlled way, so that impurities after transport are eliminated quickly and in a controlled way. In a transport container of the disclosure, the extremely extensive and rapid emptying can be realized by means of integrated rapid-empty systems envisaged specifically for that purpose, typically configured as what are called quick dump valves, and can therefore be adapted more effectively in order to prevent repeated adhesion of particles after their removal from surfaces.

It has proven particularly advantageous if the transport container comprises one or more integrated workpiece holders for semiconductor wafers and/or carriers for semiconductor wafers, allowing the semiconductor wafers for transport to be loaded in a standing format.

A usual feature of the containers on the market is that they are fitted to a transport system in such a way that the axis of the direction of transport always coincides with the same axis of the transport container. It is therefore not possible for the container to be mounted with a 900 rotation, for example. There is therefore a designated transport axis for the container.

The inventors have recognized that the semiconductor wafers are mounted in a transport container in such a way that the front or rear side of the semiconductor wafer runs parallel to the designated transport direction.

An effect of this is that liquid moving during transport is unable to exert any force, or any substantial force, on the semiconductor wafers. If the semiconductor wafers were to be transported with rotation by 90°, for example, there would be increased damage (fracture).

Accordingly, the holders for the semiconductor wafers to be transported within the 3D-printed transport container are preferably located so as to allow the liquid contained therein to move, during transport, between the semiconductor wafers, parallel to the wafer surfaces. As a result, the initiation of force resulting from liquids sloshing in the wafer surfaces is reduced, relative movements of the wafers in the wafer holders are minimized, and instances of damage to wafer surfaces are avoided.

It has proven particularly advantageous if the transport containers used comprise energy stores for electrical energy, which can be used to operate electrical components.

It is especially preferred if, additionally, elements for electronic data processing, such as a mini PC, for instance, are built into the transport container.

This considerably increases the possibilities for use, enabling, for instance, installed suitable sensors to record movement profiles which are useful for tracing in the event of faults.

FIGS. 1a-e represent schematically a sequence of a process in a preferred embodiment. Represented first of all for this purpose, coarsely schematically, in FIG. 1a is an apparatus 106 for an additive construction process, e.g., a 3D printer, which has a printing head 104 supplied with a base material 105. The printing head 104 then first applies a first layer 101 of the container being produced on a support 107.

This is followed by the application of further layers, specifically by the respective application of a new layer to each preceding layer. Shown illustratively is, in FIG. 1b, a further layer 102, which is applied to the layer 101, and, in FIG. 1c, a further layer 103 which is applied to the layer 102.

In this way the container 100 is produced from the base material by means of an additive construction process in a desired or mandated shape, as shown coarsely schematically in FIG. 1d. As likewise shown in FIG. 1d, a coating material 108 is applied, for example, to the internal surfaces of the container 100, which is open at the top, this application taking place by means of, for example, of an application tool 111 which is supplied with the coating material 108 from a tank 109.

The container 100 included in this way is then dried, more particularly sintered, in an oven 112, as shown in FIG. 1e, for example, for a predetermined period of time within a predetermined temperature range which is below a dimensional integrity temperature of the base material 105, e.g., at 150° C. In this way the completed transport container 110 is formed, which thus is also chemicals-resistant.

Figure 2:
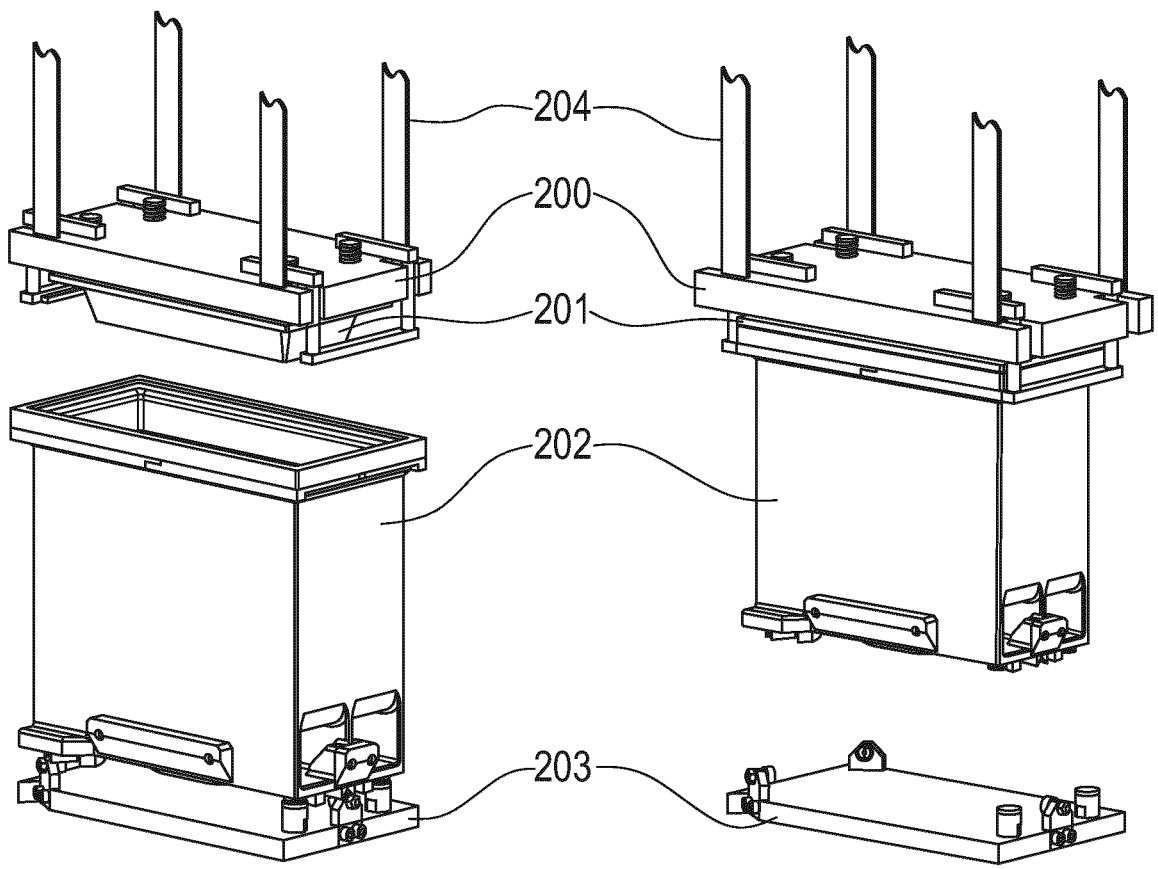
FIG. 2 shows schematically a transport container of the disclosure in a preferred embodiment.

Represented schematically in FIG. 2 is a transport container 202 of the disclosure in a preferred embodiment, as may be produced, for example, by means of the process shown in FIGS. 1a-e and described with reference to that figure. Shown in particular in this case is the shape or shaping of the transport container 202; the coating with the coating material, already addressed in relation to FIGS. 1a-e, is not shown explicitly here, for reason of clarity.

The lid of the container 201 is in this way securely assembled with the OHT transport vehicle 200, which is in turn suspended on attachments 204, suitable for vertically moving the transport vehicle.

Figure 3:
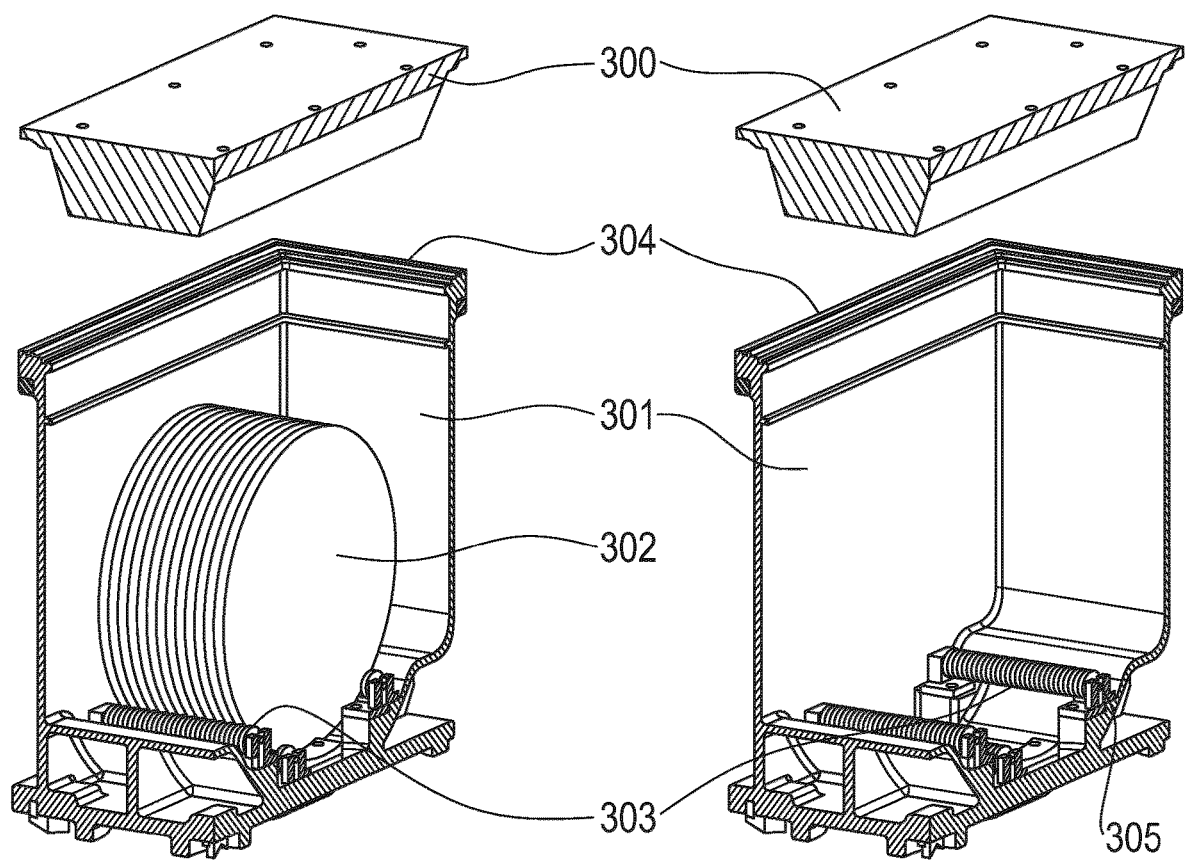
FIG. 3 likewise shows a transport container of the disclosure in a detailed sectional representation.

FIG. 3 shows two sections through a preferred transport container. A lid 300, which can be placed onto the container 301 by means of a sealing system 304, protects against leak of liquid during transport of the container. A plurality of semiconductor wafers 302, mounted in a workpiece holder 303, can be transported securely in the container. The preferred intended transport direction of the transport container is along the front or rear side of the stored semiconductor wafers 302.

A particularly preferred drive unit 305 ensures that the semiconductor wafers can be rotated during transport and that consequently there can be no formation of deposition sites for contamination on the edges of the semiconductor wafers.

As already mentioned, a number of times, the proposed additive construction process permits free and hence optimized design of wafer transport containers, for example. There is no need for attached and installed components which influence the operations within the containers; instead, the container can also be constructed without welds and without superfluous material. Chemicals draining ports can be located at the process-relevant positions, hence ensuring exact removal of the reactive chemicals at and from the wafer and container surfaces.

The construction form can be very precisely by the 3D printing process to a required liquid volume; typically, a certain number of wafers can be transported during wet transports completely immersed in the liquid. As can be seen in FIG. 3, the shape of the transport container is adapted to a particular number of wafers, and hence the volume for liquids to be introduced into the container, for example, is also reduced to a required minimum.

The construction form is fluidically optimized, typically for wafer transports, in order thereby to achieve the transporting-away of particles and chemical residues from wafer and container surfaces toward removal ports without further accumulation of the particles on surfaces. For this purpose preferably a central port arranged on the container base is mounted for the accommodation of a valve for rapid emptying in the transport container.

Additionally provided, preferably, is a workpiece holder 304 which is integrated into the transport container by appropriate shaping during the production of said container. A carrier or wafer carrier can preferably be inserted flush and securely into this workpiece holder 304.

With particular preference one or more semiconductor wafers can be inserted directly—without the use of a wafer carrier—into a workpiece holder. The orientation of the workpiece holder is designed preferably such that during wet transports with filled containers, there is no initiation of force as a result of liquids sloshing against the wafer surfaces and consequently no relative movements caused to the wafers in the wafer holders. The slots of the wafer holders are arranged in the transport direction of the containers.

Additionally, possible are integrated frames and attachments (including mechanical coupling elements) for simple adaptation to receiving devices of transport systems, e.g., overhead hoist transport systems. With particular preference a variety of mechanical coupling elements are provided simultaneously on the underside of the transport container. The coupling elements serve for precise and consistent positioning on operating lines, for loading with wafers using robot systems, for example, without specialty measurement techniques for capturing the container position.

By suitable shaping, furthermore, a sensor holder is formed, illustratively, into which a sensor can be inserted, this sensor possibly serving, for example, to monitor a defined fill level.

It may be mentioned at this point that the functions or components integrated into the form of the transport container here are merely illustrative. Further components and/or functions may also be provided. Depending on the desired use of the transport container, it is also possible for only certain components and/or functions to be provided.

While subject matter of the present disclosure has been illustrated and described in detail in the drawings and foregoing description, such illustration and description are to be considered illustrative or exemplary and not restrictive. Any statement made herein characterizing the invention is also to be considered illustrative or exemplary and not restrictive as the invention is defined by the claims. It will be understood that changes and modifications may be made, by those of ordinary skill in the art, within the scope of the following claims, which may include any combination of features from different embodiments described above.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

Abbreviations

100 Coated container
101 First layer of the container being produced
102 Second layer of the container being produced
103 Further layer of the container being produced
104 Printing head
105 Base material
106 3D printer
107 Support
108 Coating material
109 Tank
110 Transport container
111 Application tool
112 Oven
200 OHT transport vehicle
201 Lid of the transport container, securely mounted with the OHT transport vehicle
202 Transport container
203 Carrier system for a transport container
204 Attachments for the vertical transport of the transport vehicle
300 Lid of the container
301 Container
302 Semiconductor wafers
303 Workpiece holder for semiconductor wafers
304 Sealing system between container and lid
305 Drive unit able to rotate the semiconductor wafers stored in the container under liquid.

The invention claimed is:

1. A transport container for transporting semiconductor wafers, the transport container comprising:
   a mandated shape generated from a base material by 3D printing; and
   in at least a region of a surface of the transport container, a coating material configured for protection from chemicals capable of etching the semiconductor wafers,
   wherein the coating material has been applied by a low-temperature coating process,
   wherein the coating material consists of one of polytetrafluoroethylene, a perfluoroalkoxy polymer, and polyvinylidene fluoride,
   wherein the mandated form of the transport container comprises a device in a base that is suitable for removing liquid media,
   wherein the mandated form of the transport container comprises one or more integrated workpiece holders for the semiconductor wafers or carriers for the semiconductor wafers, configured such that that the semiconductor wafers to be transported are loadable in standing form, and
   wherein the transport container is configured for a designated transport direction of the transport container in an automatic transport system that runs parallel to a front side or a rear side of the semiconductor wafers.

2. The transport container as claimed in claim 1, wherein the device capable of removing liquid media is configured such that it is opened automatically by the deposition of the transport container.

3. The transport container as claimed in claim 1, comprising active energy stores for electrical energy.

4. The transport container as claimed in claim 1, comprising a system for electronic data processing.

5. The transport container as claimed in claim 1, comprising one or more securing devices configured for securing the container both to a floor-based transport system and to a ceiling-based transport system.

6. The transport container as claimed in claim 1, comprising one or more cover apparatuses configured for preventing emergence of liquid during a transport operation.

7. The transport container as claimed in claim 1, wherein a weight of the transport container filled with liquid and the semiconductor wafers is more than 15 kg and less than 120 kg.

8. The transport container according to claim 1, wherein the coating material has been applied by a sintering process having a temperature below 150° C.

9. A process for transporting the semiconductor wafers, which comprises using the transport container as claimed in claim 1.

10. A method for producing a transport container for transporting semiconductor wafers, the method comprising:
 using a 3D printing to produce the transport container with a mandated shape from a base material;
 applying, in at least a region of a surface of the transport container, a coating material configured for protection from chemicals capable of etching the semiconductor wafers, the coating material being applied with a low-temperature sintering process below 150° C., the coating material consisting of one of polytetrafluoroethylene, a perfluoroalkoxy polymer, and polyvinylidene fluoride,
wherein the mandated form of the transport container comprises a device in a base that is configured for removing liquid media,
wherein the mandated form of the transport container comprises one or more integrated workpiece holders for semiconductor wafers or carriers for semiconductor wafers, so that the semiconductor wafers to be transported can be loaded in standing form, and
wherein the transport container is configured such that a designated transport direction of the transport container in an automatic transport system runs parallel to a front side or a rear side of the semiconductor wafers.

\* \* \* \* \*